(12) United States Patent
Singh et al.

(10) Patent No.: US 10,670,971 B2
(45) Date of Patent: Jun. 2, 2020

(54) CONFIGURING OPTICAL LAYERS IN IMPRINT LITHOGRAPHY PROCESSES

(71) Applicant: Magic Leap, Inc., Plantation, FL (US)

(72) Inventors: Vikramjit Singh, Pflugerville, TX (US); Michael Nevin Miller, Austin, TX (US); Frank Y. Xu, Austin, TX (US); Shuqiang Yang, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 16/165,027

(22) Filed: Oct. 19, 2018

(65) Prior Publication Data

US 2019/0121239 A1 Apr. 25, 2019

Related U.S. Application Data

(60) Provisional application No. 62/574,826, filed on Oct. 20, 2017.

(51) Int. Cl.
| | | |
|---|---|---|
| *H05K 1/00* | (2006.01) | |
| *G03F 7/20* | (2006.01) | |
| *G03F 7/00* | (2006.01) | |
| *G02B 1/118* | (2015.01) | |

(52) U.S. Cl.
CPC ............ *G03F 7/7015* (2013.01); *G02B 1/118* (2013.01); *G03F 7/0002* (2013.01)

(58) Field of Classification Search
CPC . G03F 7/0002; G03F 1/60; G03F 7/16; G03F 7/70191; G03F 9/7042; G03F 9/7065; G03F 7/2002; G03F 7/7015; G03F 7/70158; G03F 7/70866; G03F 1/00; G03F 1/24; G03F 1/26; G03F 7/0005; G03F 7/091; G03F 7/2008; G03F 7/26; G03F 7/322; G03F 9/70; G03F 9/7026; G01N 21/4788; G01N 21/9501; G01N 21/47; G01N 21/4146

See application file for complete search history.

(56) References Cited

U.S. PATENT DOCUMENTS

| | | | |
|---|---|---|---|
| 2005/0095699 A1 | 5/2005 | Miyauchi | |
| 2009/0029145 A1 | 1/2009 | Thies | |
| 2009/0081594 A1* | 3/2009 | Chen | G03F 1/62 430/322 |
| 2010/0052216 A1* | 3/2010 | Kim | B29C 59/02 264/284 |

(Continued)

FOREIGN PATENT DOCUMENTS

WO WO2015079051 A1 6/2015

OTHER PUBLICATIONS

International Search Report and Written Opinion for International Application No. PCT/US2018/056644, dated Dec. 10, 2018, 17 pages.

*Primary Examiner* — Mesfin T Asfaw
(74) *Attorney, Agent, or Firm* — Fish & Richardson P.C.

(57) ABSTRACT

An imprint lithography method of configuring an optical layer includes selecting one or more parameters of a nanolayer to be applied to a substrate for changing an effective refractive index of the substrate and imprinting the nanolayer on the substrate to change the effective refractive index of the substrate such that a relative amount of light transmittable through the substrate is changed by a selected amount.

3 Claims, 14 Drawing Sheets

(56) References Cited

U.S. PATENT DOCUMENTS

| | | | |
|---|---|---|---|
| 2014/0299364 A1* | 10/2014 | Divigalpitiya | H05K 1/02 |
| | | | 174/254 |
| 2017/0059913 A1* | 3/2017 | Ku | G02F 1/13338 |
| 2017/0131460 A1 | 5/2017 | Lin | |
| 2018/0052501 A1 | 2/2018 | Jones | |
| 2018/0157170 A1 | 6/2018 | Singh | |

* cited by examiner

CONFIGURING OPTICAL LAYERS IN IMPRINT LITHOGRAPHY PROCESSES

CROSS-REFERENCE TO RELATED APPLICATION

This application claims the benefit of the filing date of U.S. Provisional Application No. 62/574,826, filed on Oct. 20, 2017. The contents of U.S. Application No. 62/574,826 are incorporated herein by reference in their entirety.

TECHNICAL FIELD

This invention relates to configuring optical layers in imprint lithography processes, and more particularly to forming anti-reflective features on a substrate to tune light transmission through the substrate.

BACKGROUND

Nanofabrication (e.g., nanoimprint lithography) is the fabrication of very small structures that have features on the order of 100 nanometers or smaller. One application in which nanofabrication has had a significant impact is in the processing of integrated circuits. The semiconductor processing industry continues to strive for larger production yields, while increasing a number of circuits formed on a substrate per unit area of the substrate. To this end, nanofabrication has become increasingly important to achieving desired results in the semiconductor processing industry. Nanofabrication provides greater process control while allowing continued reduction of minimum feature dimensions of structures formed on substrates. Other areas of development in which nanofabrication has been employed include biotechnology, optical technology, mechanical systems, and the like. In some examples, nanofabrication includes fabricating structures on substrates that are assembled to form an optical device.

SUMMARY

The invention involves a realization that imprinting certain types of nanoscale features on a substrate can significantly improve transmission of light (e.g., source light and world side light) through the substrate. For example, anti-reflective (AR) patterns can be formed from of nanoscale pillars, nanoscale holes, and nanoscale gratings that diminish light reflection losses at a substrate, thereby increasing light transmission through the substrate. Depending on a size, a shape, an aspect ratio, and a pitch of the nanoscale features, light transmission through a substrate can be tuned to a desired level using patterned polymer films of index varying from 1.49 to 1.74. In this regard, AR patterns formed on a substrate can also provide the substrate with a new effective refractive index. Such features can be imprinted within ultra thin films of less than 150 nm thickness, thereby conserving material use and further enabling use of stacked waveguides using thin imprinted layers over glass substrates. Nanoscale features being imprinted have an overall pitch and dimensions of less than 300 nm, such that the nanoscale features do not cause unwanted diffraction or light scattering as light propagates through each layer in a multicolor waveguide stack. Such imprinted nanoscale features also enable higher transmission of world side light through each layer, thereby enhancing world side objects as viewed through a user's eye (e.g., pupil). Such nanoscale features can also act as dummy fill regions around edges of waveguide pattern geometry, enabling smooth transition of resist fluid prior to curing through a patterned region to another patterned region versus a patterned region to a blank unpatterned region. These nanoscale features are imprinted with a very thin residual layer thicknesses of less than 100 nm, which allows the pattern transfer into any underlying material layer or directly into the substrate to enhance the anti-reflective properties of that layer or just the bare substrate, itself.

One aspect of the invention features an imprint lithography method of configuring an optical layer. The imprint lithography method includes selecting one or more parameters of a nanolayer to be applied to a substrate for changing an effective refractive index of the substrate and imprinting the nanolayer on the substrate to change the effective refractive index of the substrate such that a relative amount of light transmittable through the substrate is changed by a selected amount In some embodiments, the relative amount of light is a first relative amount of light, and imprinting the nanolayer on the substrate to change the effective refractive index of the substrate includes changing a second relative amount of light reflected from a surface of the substrate.

In certain embodiments, the imprint lithography method further includes selecting one or more of a shape, a dimension, and a material formulation of the nanolayer.

In some embodiments, the imprint lithography method further includes imprinting a flat nanoimprint on the substrate.

In certain embodiments, the imprint lithography method further includes imprinting a featured nanoimprint on the substrate.

In some embodiments, the imprint lithography method further includes imprinting one or more anti-reflective (AR) features on the substrate.

In certain embodiments, the one or more AR features have a height in a range of about 10 nm to about 300 nm.

In some embodiments, the one or more AR features have a width in a range of about 10 nm to about 150 nm.

In certain embodiments, the imprint lithography method further includes distributing the one or more AR features with a pitch in a range of about 20 nm to about 200 nm.

In some embodiments, the imprint lithography method further includes forming pillars on the substrate.

In certain embodiments, the imprint lithography method further includes forming holes on the substrate.

In some embodiments, the imprint lithography method further includes forming one or both of continuous gratings and discontinuous gratings on the substrate.

In certain embodiments, the imprint lithography method further includes forming a functional pattern on a first side of the substrate and imprinting the nanolayer along one or both of the first side of the substrate and a second side of the substrate opposite the first side of the substrate.

In some embodiments, the imprint lithography method further includes forming an array of AR features of the nanolayer along a specific direction with respect to the functional pattern.

In certain embodiments, the imprint lithography method further includes forming the AR features of the nanolayer on the substrate to change the effective refractive index of the substrate based on a direction of light propagation such that light transmitted through the substrate is changed by the selected amount.

In some embodiments, the imprint lithography method further includes applying a film coating to the substrate and imprinting the nanolayer atop the film coating.

In certain embodiments, the imprint lithography method further includes changing the relative amount of light transmittable through the substrate by about 0.5% to about 15%.

In some embodiments, the nanolayer is a first nanolayer, and the imprint lithography method further includes imprinting a second nanolayer atop the first nanolayer.

In certain embodiments, the imprint lithography method further includes changing the effective refractive index to a first value based on the first nanolayer and changing the effective refractive index to a second value based on the second nanolayer.

Another aspect of the invention features an optical layer that includes a substrate and a nanolayer imprinted on the substrate, the nanolayer determining an effective refractive index of the substrate such that the nanolayer effects a relative amount of light transmittable through the substrate.

Another aspect of the invention features an optical device that includes a first optical layer and a second optical layer. The first optical layer includes a first substrate and a nanolayer imprinted on the first substrate. The second optical layer includes a second substrate, and a functional pattern disposed along the second substrate. The nanolayer imprinted on the first substrate determines an effective refractive index of the first substrate such that the nanolayer increases a relative amount of light transmittable through the first substrate to the second optical layer.

In some embodiments, the functional pattern disposed along the second substrate is a first functional pattern, and the optical device further includes a third optical layer including a third substrate and a second functional pattern disposed along the third substrate.

In certain embodiments, the nanolayer imprinted on the first substrate is a first nanolayer, the effective refractive index of the first substrate is a first refractive index, the relative amount of light is a first relative amount of light, and the second optical layer includes a second nanolayer imprinted on the second substrate, the second nanolayer determining a second effective refractive index of the second substrate such that the second nanolayer increases a second relative amount of light transmittable through the second substrate to the third optical layer.

In some embodiments, the first and second nanolayers are configured such that a final amount of light transmitted through the first and second substrates to the third optical layer is about equal to an amount of light directed from a source to the first nanolayer, minus a first amount of light reflected from the first substrate and minus a second amount of light reflected from the second substrate.

The details of one or more embodiments of the invention are set forth in the accompanying drawings and the description below. Other features, aspects, and advantages of the invention will be apparent from the description, the drawings, and the claims.

BRIEF DESCRIPTION OF THE DRAWINGS

Like reference symbols in the various figures indicate like elements.

Figure 1:
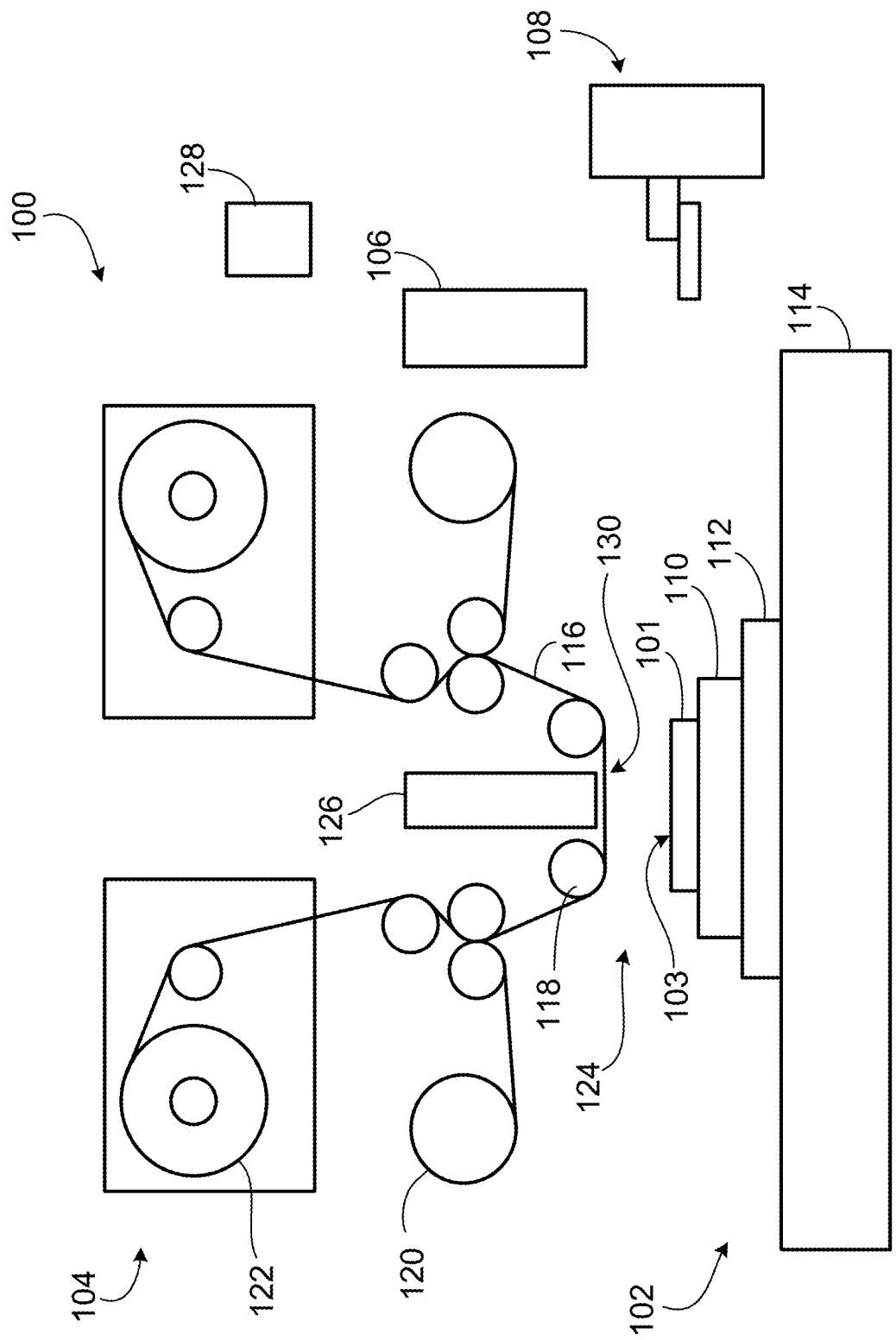
FIG. 1 is a diagram of an imprint lithography system.

In some examples, illustrations shown in the drawings may not be drawn to scale.

DETAILED DESCRIPTION

An imprint lithography process for configuring an optical layer is described below. The imprint lithography process involves forming nanoscale surface relief pattern anti-reflective (AR) imprints on substrates. Such AR imprints serve to increase light transmission through the substrate to varying degrees, depending on various geometric properties of the AR imprints.

FIG. 1 illustrates an imprint lithography system 100 that is operable to form a relief pattern on a top surface 103 of a substrate 101 (e.g., a wafer). The imprint lithography system 100 includes a support assembly 102 that supports and transports the substrate 101, an imprinting assembly 104 that forms the relief pattern on the top surface 103 of the substrate 101, a fluid dispenser 106 that deposits a polymerizable substance upon the top surface 103 of the substrate 101, and a robot 108 that places the substrate 101 on the support assembly 102. The imprint lithography system 100 also includes one or more processors 128 that can operate on a computer readable program stored in memory and that are in communication with and programmed to control the support assembly 102, the imprinting assembly 104, the fluid dispenser 106, and the robot 108.

The substrate 101 is a substantially planar, thin slice that is typically made of one or more materials including silicon, silicon dioxide, titanium dioxide, zirconium dioxide, aluminum oxide, sapphire, germanium, gallium arsenide (GaAs), an alloy of silicon and germanium, indium phosphide (InP), or other example materials. The substrate 101 typically has a substantially circular or rectangular shape. The substrate 101 typically has a diameter in a range of about 50 mm to about 200 mm (e.g., about 65 mm, about 150 mm, or about 200 mm) or a length and a width in a range of about 50 mm to about 200 mm (e.g., about 65 mm, about 150 mm, or about 200 mm). The substrate 101 typically has and a thickness in a range of about 0.2 mm to about 1.0 mm. The thickness of the substrate 101 is substantially uniform (e.g., constant) across the substrate 101. The relief pattern is formed as a set of structural features (e.g., protrusions and recesses) in the polymerizable substance upon the top surface 103 of the substrate 101, as will be discussed in more detail below.

The support assembly 102 includes a chuck 110 that supports and secures the substrate 101, an air bearing 112 that supports the chuck 110, and a base 114 that supports the air bearing 112. The base 114 is located in a fixed position, while the air bearing 112 can move in up to three directions (e.g., x, y, and z directions) to transport the chuck 110 (e.g., in some instances, carrying the substrate 101) to and from the robot 108, the fluid dispenser 106, and the imprinting assembly 104. In some embodiments, the chuck 110 is a vacuum chuck, a pin-type chuck, a groove-type chuck, an electromagnetic chuck, or another type of chuck.

Still referring to FIG. 1, the imprinting assembly 104 includes a flexible template 116 with a patterning surface defining an original pattern from which the relief pattern is formed complementarily on the top surface 103 of the substrate 101. Accordingly, the patterning surface of the flexible template 116 includes structural features, such as protrusions and recesses. The imprinting assembly 104 also includes multiple rollers 118, 120, 122 of various diameters that rotate to allow one or more portions of the flexible template 116 to be moved in the x direction within a processing region 130 of the imprint lithography system 100 to cause a selected portion of the flexible template 116 to be aligned (e.g., superimposed) with the substrate 101 along the processing region 130. One or more of the rollers 118, 120, 122 are individually or together moveable in the vertical direction (e.g., the z direction) to vary a vertical position of the flexible template 116 in the processing region 130 of the imprinting assembly 104. Accordingly, the flexible template 116 can push down on the substrate 101 in the processing region 130 to form an imprint atop the substrate 101. An arrangement and a number of the rollers 118, 120, 122 can vary, depending upon various design parameters of the imprint lithography system 100. In some embodiments, the flexible template 116 is coupled to (e.g., supported or secured by) a vacuum chuck, a pin-type chuck, a groove-type chuck, an electromagnetic chuck, or another type of chuck.

In operation of the imprint lithography system 100, the flexible template 116 and the substrate 101 are aligned in desired vertical and lateral positions by the rollers 118, 120, 122 and the air bearing 112, respectively. Such positioning defines a volume 124 within the processing region 130 between the flexible template 116 and the substrate 101. The volume 124 can be filled by the polymerizable substance once the polymerizable substance is deposited upon the top surface 103 of the substrate 101 by the fluid dispenser 106, and the chuck 110 (e.g., carrying the substrate 101) is subsequently moved to the processing region 130 by the air bearing 112. Accordingly, both the flexible template 116 and the top surface 103 of the substrate 101 can be in contact with the polymerizable substance in the processing region 130 of the imprint lithography system 100. Example polymerizable substances may be formulated from one or more substances, such as isobornyl acrylate, n-hexyl acrylate, ethylene glycol diacrylate, 2-hydroxy-2-methyl-1-phenyl-propan-1-one, (2-Methyl-2-Ethyl-1,3-dioxolane-4-yl) methyl acrylate, hexanediol diacrylate, 2-methyl-1-[4-(methylthio)phenyl]-2-(4-morpholinyl)-1-propanone, diphenyl (2,4,6-trimethylbenzoyl)-phosphine oxide, 2-hydroxy-2-methyl-1-phenyl-1-propanone, and various surfactants. Example techniques by which the polymerizable substance may be deposited atop the substrate 101 by the fluid dispenser 106 include drop dispense, spin-coating, dip coating, slot-die, knife-edge coating, micro-gravure, screen-printing, chemical vapor deposition (CVD), physical vapor deposition (PVD), thin film deposition, thick film deposition, and other techniques. In some examples, the polymerizable substance is deposited atop the substrate 101 in multiple droplets.

The printing system 104 includes an energy source 126 that directs energy (e.g., broadband ultraviolet radiation) towards the polymerizable substance atop the substrate 101 within the processing region 130. Energy emitted from the energy source 126 causes the polymerizable substance to solidify and/or cross-link, thereby resulting in a patterned layer that conforms to a shape of the portion of the flexible template 116 in contact with the polymerizable substance in the processing region 130.

Figure 2:
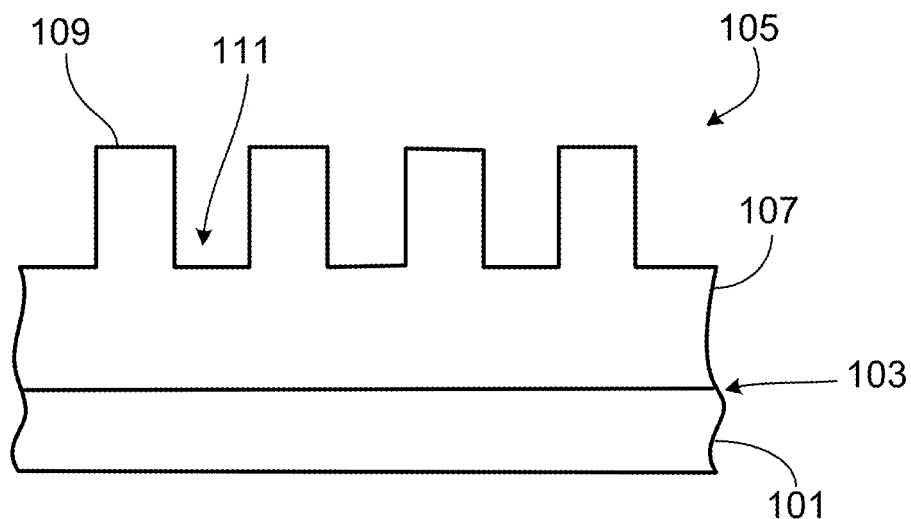
FIG. 2 is diagram of patterned layer formed by the imprint lithography system of FIG. 1.

FIG. 2 illustrates an example patterned layer 105 formed on the substrate 101 by the imprint lithography system 100. The patterned layer 105 includes a residual layer 107 and multiple features including protrusions 109 extending from the residual layer 107 and recessions 111 formed by adjacent protrusions 109 and the residual layer 107.

While the imprint lithography system 100 is described and illustrated as a roll-to-plate or plate-to-roll system, imprint lithography systems of different configurations can also be used to produce the example patterned layer 105 and the example patterns discussed below. Such imprint lithography systems may have a roll-to-roll or a plate-to-plate configuration.

In some embodiments, a substrate (e.g., the substrate 101 of the imprint lithography system 100) is processed (e.g., imprinted on one or both sides, supplied with additional features, and/or cut out to shape) to form an optical layer of an optical device. For example, a nanolayer can be imprinted on the substrate to enhance optical performances of the substrate, such as to increase or reduce a transmissivity of the substrate to light of certain wavelengths and/or to enhance birefringence of the substrate. Example optical devices include optical films (e.g., Wire Grid Polarizer (WGP) films) of high transmission (e.g., greater than 42%) and high Extinction Ratio (ER) (e.g., greater than 1000)) used in display applications (e.g., liquid crystal display (LCD) applications), touchscreen display applications (e.g., touch sensors), and to improve intensity of light transmitted from either side of an optical film, such as in a wearable eyepiece, an optical sensor, or an optical film.

Figure 3:
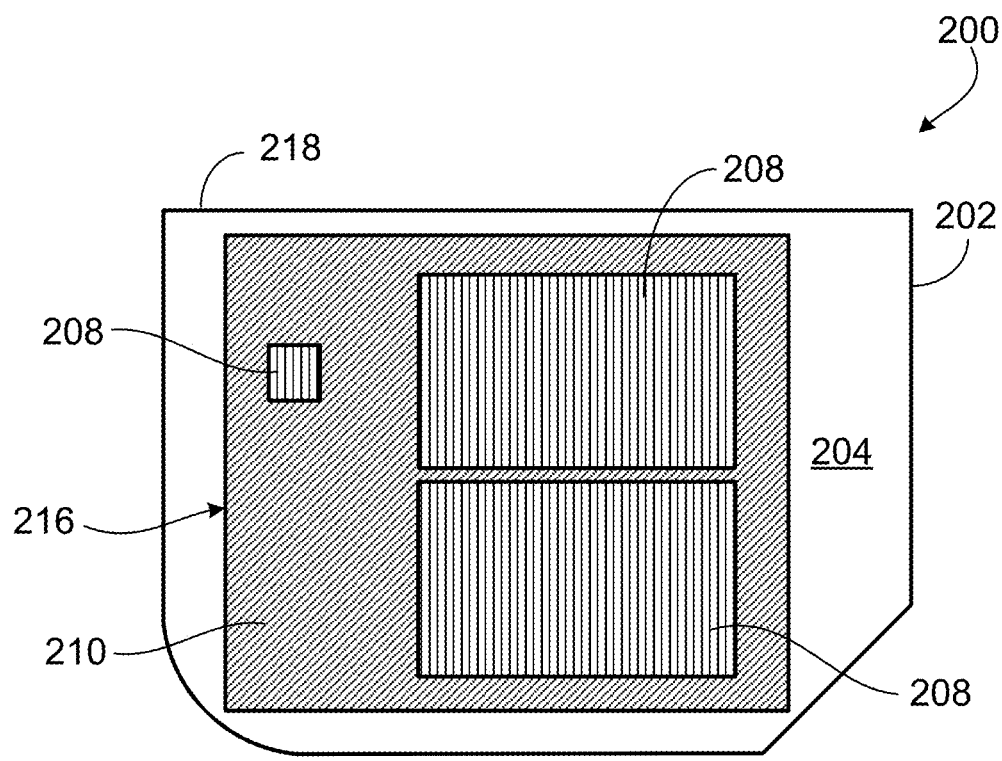
FIG. 3 is a top view of an optical layer.
Figure 4:
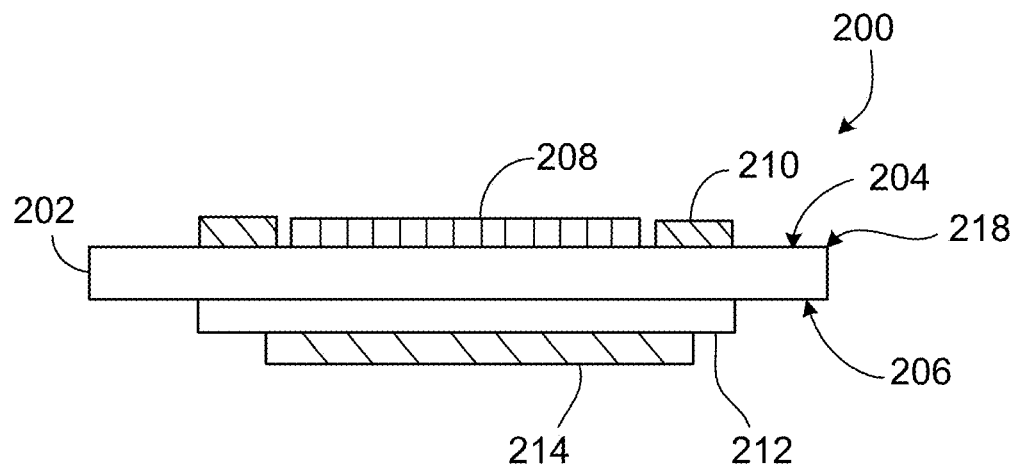
FIG. 4 is a side view of the optical layer of FIG. 3.

FIGS. 3 and 4 illustrate a top view and a side view, respectively, of an optical layer 200 that includes a substrate 202 with an upper side 204 and a lower side 206. The optical layer 200 also includes a functional pattern 208 imprinted on the upper side 204 of the substrate 202, an AR pattern 210 imprinted on the upper side 204 of the substrate 202, a film coating 212 disposed on the lower side 206 of the substrate 202, and an AR pattern 214 imprinted on the film coating 212. The substrate 202 may be laser cut from a larger substrate (e.g., the substrate 101) and is provided as a layer of transparent or semi-transparent plastic (e.g., a flexible material) or glass (e.g., a rigid material) that is made of one or more organic or inorganic materials, in accordance with the various material formulations described above with respect to the substrate 101. The substrate 202 may have a length of about 10 mm to about 150 mm (e.g., about 50 mm), a width of about 10 mm to about 150 mm (e.g., about 50 mm), and a thickness of about 0.1 mm to about 10.0 mm (e.g., about 0.3 mm). The substrate 202 has a relatively high refractive index in a range of about 1.6 to about 1.9 (e.g., about 1.8). Assuming that the substrate 202 is surrounded by air (i.e., n=1), the substrate 202 has a transmissivity (e.g., a portion of light impinging on the substrate 202 that passes through the substrate 202) in a range of about 80.00% to about 95.00% (e.g., about 91.84%) and accordingly has a reflectivity (e.g., the portion of light impinging on the substrate 202 that is reflected backwards from the substrate 202) of about 5.00% to about 20.00% (e.g., about 8.16%).

The functional pattern 208 is imprinted (e.g., via the imprint lithography system 100) along an interior region 216 of the substrate 202. The functional pattern 208 is a waveguide pattern formed of multiple diffraction gratings that provide a basic working functionality of the optical layer 200. The diffraction gratings have dimensions in a range of about 10 nm to about 600 nm. The diffraction gratings are configured to project light of wavelengths within a particular range and to focus a virtual image at a particular depth plane. The focused light, together with focused light projected through proximal optical layers, forms a multi-color virtual image over one or more depth planes. The transmitted light may be red light with wavelengths in a range of about 560 nm to about 640 nm (e.g., about 625 nm), green light with wavelengths in a range of about 490 nm to about 570 nm (e.g., about 530 nm), or blue light with wavelengths in a range of about 390 nm to about 470 nm (e.g., about 455 nm). The diffraction gratings can include multiple combinations and arrangements of protrusions and recessions (e.g., such as the protrusions 109 and the recessions 111) that together provide desired optical effects. The diffraction gratings include in-coupling gratings and may form an orthogonal pupil expander region and an exit pupil expander region. The functional pattern 208 has a total length of about 10 mm to about 150 mm and a total width of about 10 mm to about 150 mm.

The film coating 212 is also disposed along the interior region 216 of the substrate 202. The film coating 212 can provide the substrate 202 with various properties or capabilities, such as abrasion resistance, improved surface hydrophobicity, color filtration, and brightness enhancement. Example film coatings 212 include Zirconium Dioxide based hard coats for chemical barrier coating and adding hydrophobicity and a Titanium Dioxide and Silicon Dioxide hard coating for abrasion resistance and use as inorganic based anti-reflective films. The film coating 212 may be applied to the substrate 202 via techniques such as lamination, slot-die coating, physical vapor deposition, evaporation, sputtering, and chemical vapor deposition.

The AR pattern 210 is imprinted (e.g., via the imprint lithography system 100) along the interior region 216 of the substrate 202 and surrounding the functional pattern 208. The AR pattern 210 has a length of about 0.5 mm to about 150 mm and a width of about 0.5 mm to about 150 mm. The AR pattern 214 is imprinted (e.g., via the imprint lithography system 100) across the film coating 212. The AR pattern 214 has a length of about 0.5 mm to about 150 mm and a width of about 0.5 mm to about 150 mm. The AR patterns 210, 214 include AR features of a nano-scale that may be distributed in various quantities, arrangements, shapes, sizes, and orientations anywhere within the AR patterns 210, 214. AR features within the AR pattern 210 may be either abutted seamlessly to the nearest diffraction grating of the functional pattern 208 or positioned at least about 5 µm from a nearest diffraction grating of the functional pattern 208. The AR features are sized, arranged, and shaped to increase light transmission (e.g., to reduce surface reflection) at the side of the substrate 202 on which the AR patterns 210, 214 are imprinted.

Figure 5:
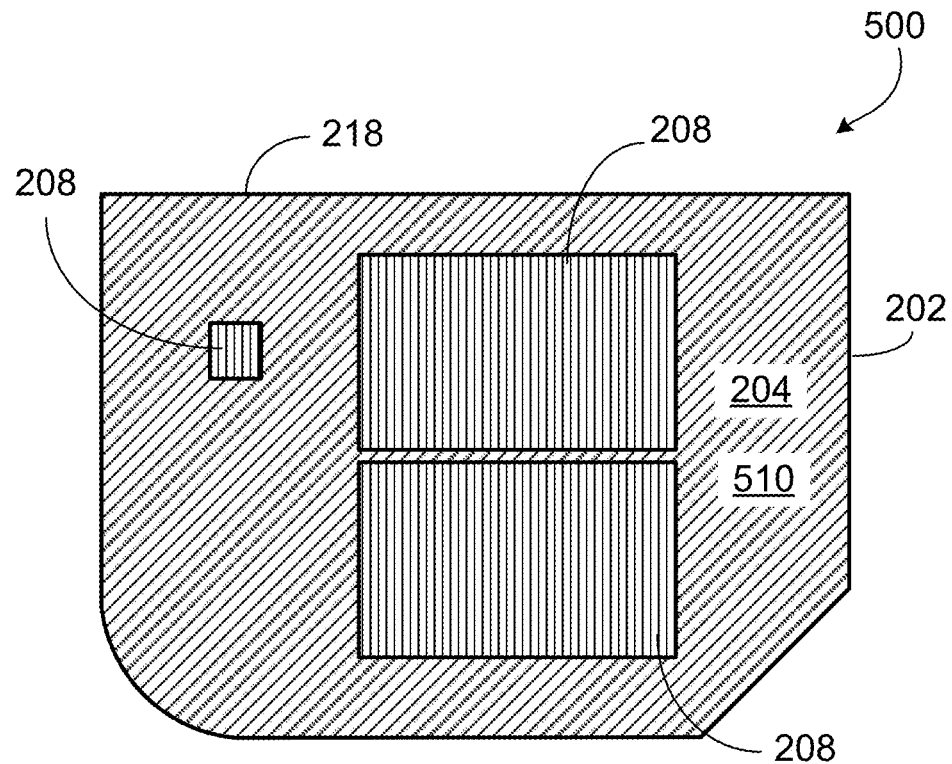
FIG. 5 is a top view of an optical layer.

While FIGS. 3 and 4 illustrate a certain embodiment of an optical layer 200, optical layers can include other arrangements of functional patterns, AR patterns, and film coatings. For example, FIG. 5 illustrates a top view of an optical layer 500 that includes the substrate 202 and the functional pattern 208 of the optical layer 200, as well as an AR pattern 510. The functional pattern 208 is imprinted atop the upper side 204 of the substrate 202, as in the optical layer 200. The AR pattern 510 is also imprinted atop the upper side 204 of the substrate 202 and is substantially similar in construction and function to the AR pattern 210, except that the AR pattern 510 extends across the interior region 216 to a peripheral edge 218 of the substrate 202.

Figure 6:
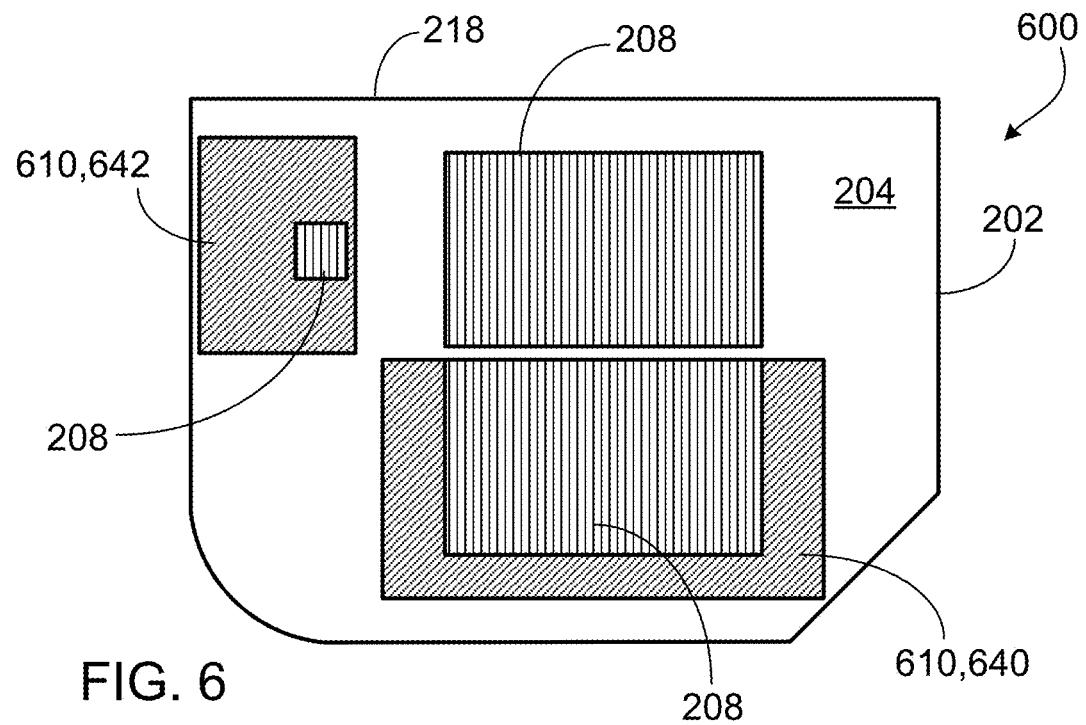
FIG. 6 is a top view of an optical layer.

In another example embodiment, FIG. 6 illustrates a top view of an optical layer 600 that includes the substrate 202 and the functional pattern 208 of the optical layer 200, as well as an AR pattern 610. The functional pattern 208 is imprinted atop the upper side 204 of the substrate 202, as in the optical layer 200. The AR pattern 610 is also imprinted atop the upper side 204 of the substrate 202 and is substantially similar in construction and function to the AR pattern 210, except that the AR pattern 610 is provided as two separate regions 640, 642 that surround separate portions of the functional pattern 208.

Figure 7:
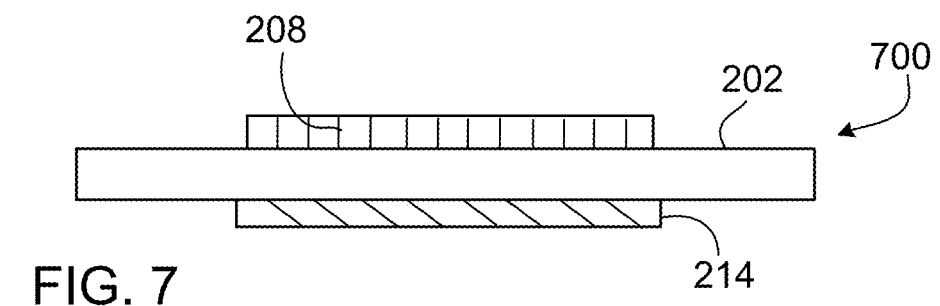
FIG. 7 is a side view of an optical layer.

In another example embodiment, FIG. 7 illustrates a side view of an optical layer 700 that includes the substrate 202, the functional pattern 208 of the optical layer 200, and the AR pattern 214 of the optical layer 200 without including the AR pattern 210 and the film coating 212. In the example optical layer 700, the AR pattern 214 is imprinted directly on the lower side 206 of the substrate 202.

Figure 8:
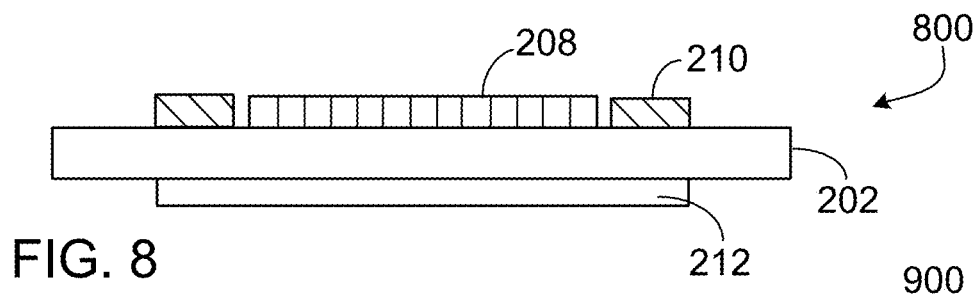
FIG. 8 is a side view of an optical layer.

In another example embodiment, FIG. 8 illustrates a side view of an optical layer 800 that includes the substrate 202, the functional pattern 208 of the optical layer 200, the AR pattern 210 of the optical layer 200, and the film coating 212 of the optical layer 200 without including the AR pattern 214.

Figure 9:
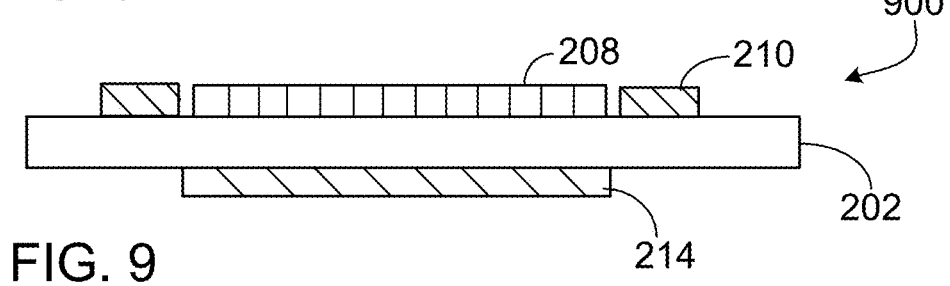
FIG. 9 is a side view of an optical layer.

In another example embodiment, FIG. 9 illustrates a side view of an optical layer 900 that includes the substrate 202, the functional pattern 208 of the optical layer 200, the AR pattern 210 of the optical layer 200, and the AR pattern 214 of the optical layer 200 without including the film coating 212. In the example optical layer 900, the AR pattern 214 is imprinted directly on the lower side 206 of the substrate 202. In other embodiments, optical layers may include functional patterns and AR patterns with different shapes and/or arrangements not shown in the example optical layers 200, 500, 600, 700, 800, 900.

Figure 10:
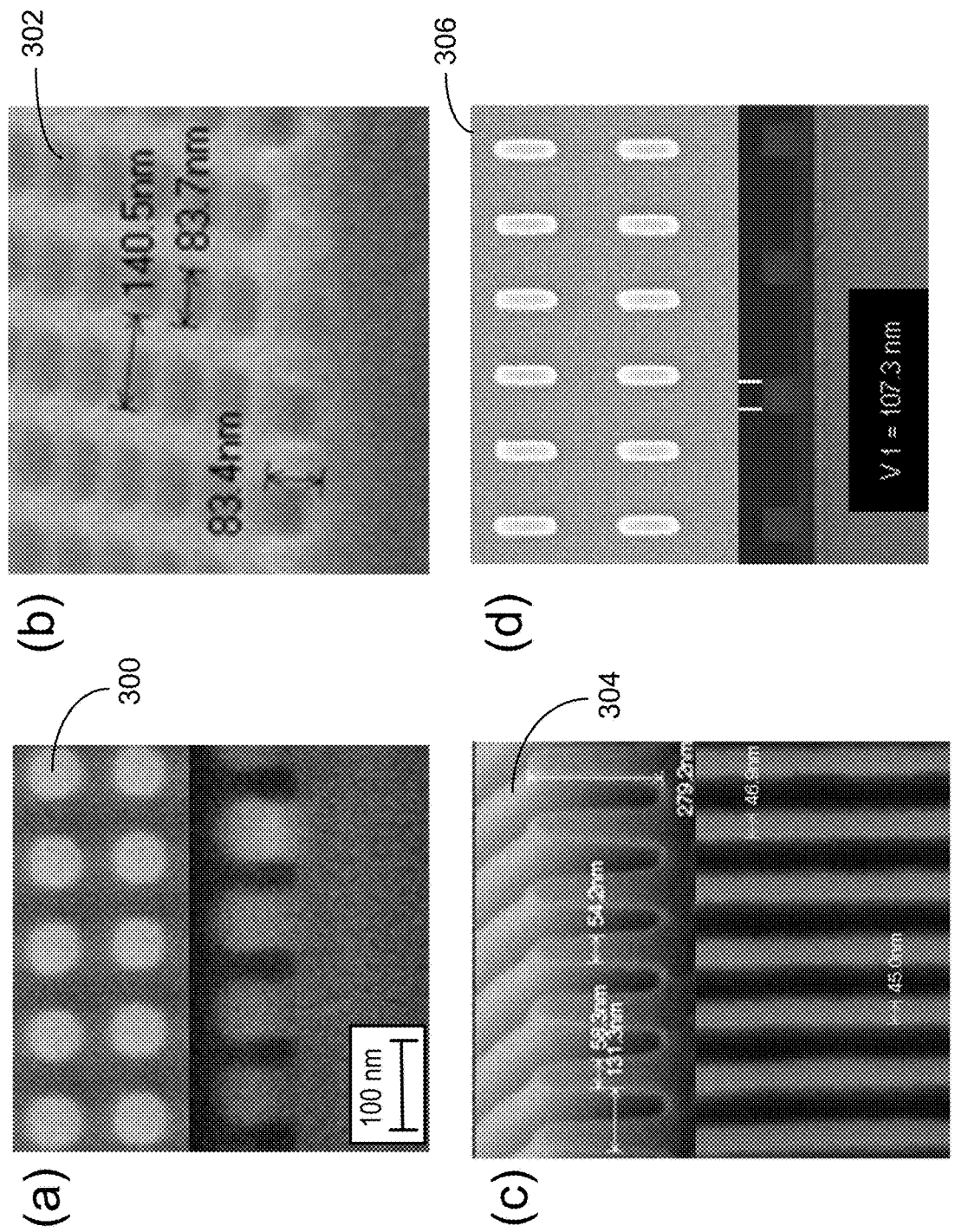
FIG. 10 provides SEM images (a)-(d) illustrating side views of various anti-reflective (AR) features.

FIG. 10 provides scanning electron micrograph (SEM) images (a)-(d) of example AR features that may form the AR patterns 210, 214. For example, SEM image (a) illustrates AR features formed as free standing, isolated protrusions such as pillars 300. The pillars 300 can be cylindrical, polygonal prism, conical, tetrahedral or frustoconical in shape. The pillars 300 have a height of about 10 nm to about 300 nm, a width of about 10 nm to about 150 nm, and a pitch (e.g., a distance between corresponding points on adjacent, like elements) of less than about 200 nm. SEM image (b) illustrates AR features formed as holes 302. The holes 302 can be cylindrical, polygonal prism, conical, tetrahedral or frustoconical in shape. The holes 302 have a depth of about 10 nm to about 300 nm, a width of about 10 nm to about 150 nm and a pitch of less than about 200 nm. The pillars 300 and holes 302 may be distributed in a hexagonally closed packed array or a square packed array. SEM image (c) illustrates AR features formed as gratings 304 (e.g., elongate horizontal bars having a length greater than a maximum width and a maximum height). The gratings 204 can be rectangular, frustoconical, ellipsoidal, or triangular in cross-sectional shape in a plane orthogonal to the direction of the gratings 304. The gratings 304 have a height of about 10 nm to about 300 nm, a width of about 10 nm to about 150 nm, and a pitch of less than about 200 nm. SEM image (d) illustrates AR features formed as discontinuous or short gratings or rods 306. These features can be rectangular, frustoconical, ellipsoidal, or triangular in cross-sectional shape in a plane orthogonal to the direction of the longer dimension axis. The features 306 have a height of about 10 nm to about 300 nm, a width of about 10 nm to about 150 nm, a length greater than about 5 µm, and a pitch of less than about 200 nm. In general, AR features of the AR patterns 210, 214 may have heights in a range of about 30 nm to about 300 nm, may have widths in a range of about 20 nm to about 100 nm, and may be distributed with pitches in a range of about 50 nm to about 200 nm.

Figure 11:
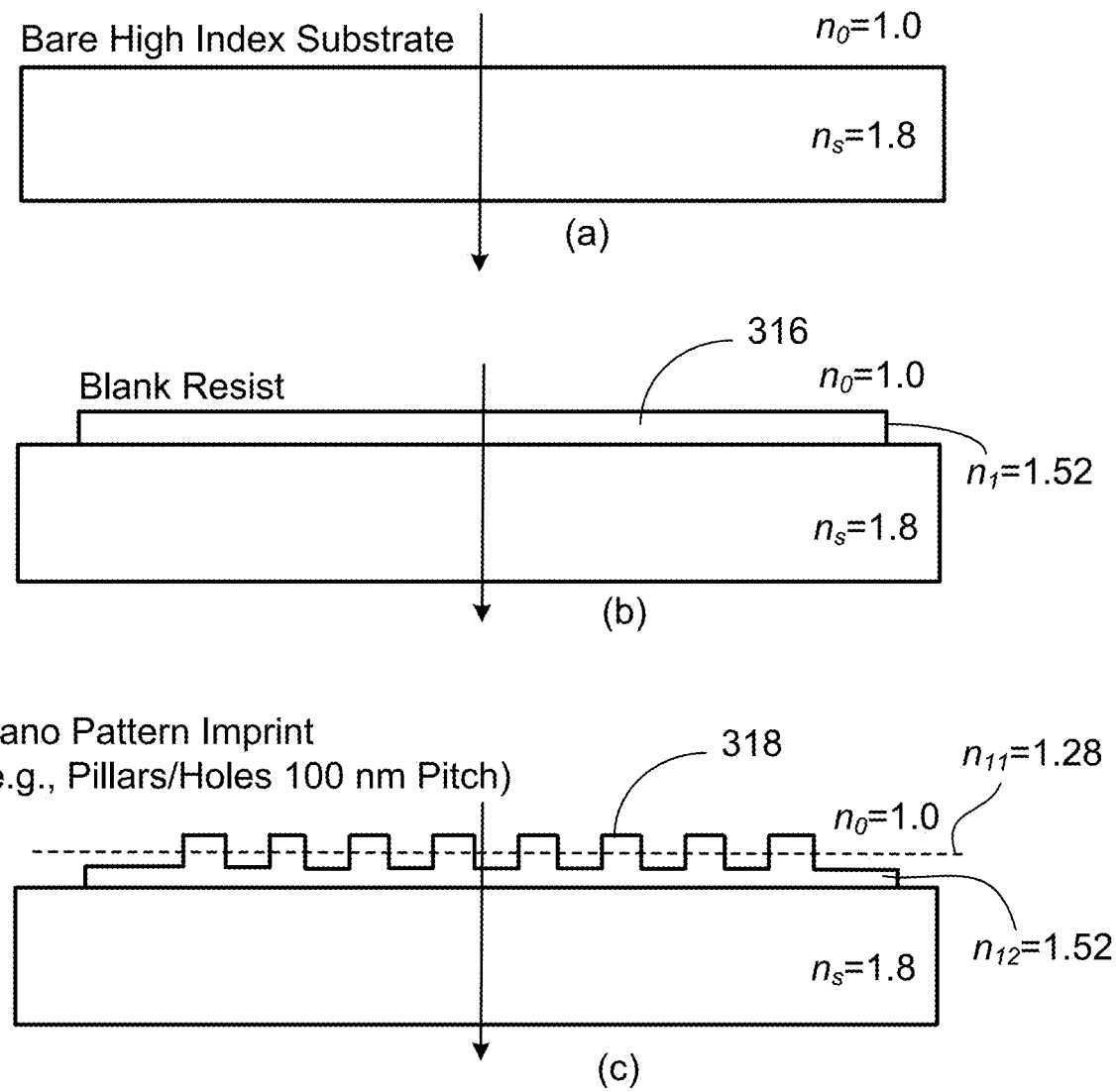
FIG. 11 is a diagram illustrating effects of nanopatterns applied directly atop a substrate.

FIG. 11 illustrates effects of AR nanolayers applied (e.g.,) directly atop a substrate (e.g., the substrate 202 or another substrate used to form optical layers in imprint lithography processes) according to a process such as nano-imprint lithography, photolithography, dry or wet etch, coat, lift-off, or lamination. Light passing from a first medium of a first refractive index $n_0$ to a second medium of a second refractive index $n_s$ at a 0 degree incidence will be reflected at an interface of the first and the second mediums according to a reflectivity R given by Eqn. 1 and transmitted through the second medium according to a transmissivity T given by Eqn. 2 (ignoring loss due to absorption, scatter, etc.). An optimal index of refraction $n_1$ of an intermediate layer between the first and second mediums can be approximated from the refractive indexes of the first and second mediums according to Eqn. 3 to produce low reflection loss at the interface. For example, Eqn. 1 is a general equation for reflection loss at a single interface (e.g., a flat interface) of a given index. Nanofeatures etched into such a substrate will change the index of the surface and thus change the reflection loss. Therefore, in a general estimation, a single layer over a flat surface for reducing reflection loss has a general index that is given by Eqn. 3.

$$R_{s-0} = \left| \frac{n_s - n_0}{n_s + n_0} \right|^2 \quad (1)$$

$$T = 1 - R \quad (2)$$

$$n_1 = \sqrt{n_0 \cdot n_s} \quad (3)$$

For example, as shown in illustration (a), about 8.16% ($R_{s-0}$=0.0816) of light passing through air ($n_0$=1.0) and directly incident on the substrate ($n_s$=1.8) is reflected from the substrate, while about 91.84% (T=0.9184) of the incident light is transmitted to the substrate. For light passing through air and incident on the substrate, the optimal index of refraction $n_1$ for an intermediate layer at that interface is around 1.34.

As shown in illustration (b), applying a flat nanoimprint 316 with a thickness of less than 100 nm with a bulk index of refraction of 1.52 (n=1.52) to the substrate causes a first amount of incident light (i.e., 4.26%) to be reflected at an interface between air and the flat nanoimprint 316 and causes a second amount of incident light (i.e., 0.71%) to be reflected at an interface between the flat nanoimprint 316 and the substrate. The reflected amounts of light can be summed to give a total amount of light reflection loss of 4.97%. Thus, light passing through material 316 first requires the index at that air-material interface to be about 1.23, and applying the flat nanoimprint 316 to the substrate has reduced the reflectivity and increased the transmissivity of the substrate 202 by 3.19%. As shown in illustration (c), applying a featured nanoimprint 318 (e.g., n=1.25) to the substrate causes a first amount of incident light (i.e., 1.23%) to be reflected at an interface between air and the featured nanoimprint 318 and causes a second amount of incident light (i.e., 0.65%) to be reflected at an interface between the featured nanoimprint 318 and the substrate. The reflected amounts of light can be summed to give a total amount of light reflection loss of 1.89%. Thus, applying the featured nanoimprint layer 318 to the substrate has reduced the reflectivity and increased the transmissivity of the substrate by about 3%. In a general, AR features such as those of the featured nanoimprint 318 have an interface with air that has a refractive index in a range of about 1.24 to about 1.34.

Table 1 describes measured refractive indexes of film-air interfaces of various film stack architectures that include nano-feature AR patterns along with improved through transmission of light at a wavelength of 590 nm. For example, a blank film of 100 nm thickness with a material refractive index of 1.52 over a transparent glass substrate of refractive index 1.78 gives a 4.25% improved transmission through that interface, when compared to the bare glass surface to air interface. When a blank film of higher refractive index 1.65 is used with similar 100 nm thickness instead of a refractive index of 1.52, the reflection loss is higher, and the net improvement is lower at 1.96% when compared to the bare 1.78 index glass. However, when the films are stacked in with the lowest index on top facing air and highest index 1.65 at the glass 1.78 interface, the reflection loss is lower, and improvement in transmission is 5.09% versus bare glass-air interface. This can be much improved if nanofeatures are fabricated with such material indices to bring the effective refractive index down to a more optimal level.

Figure 12:
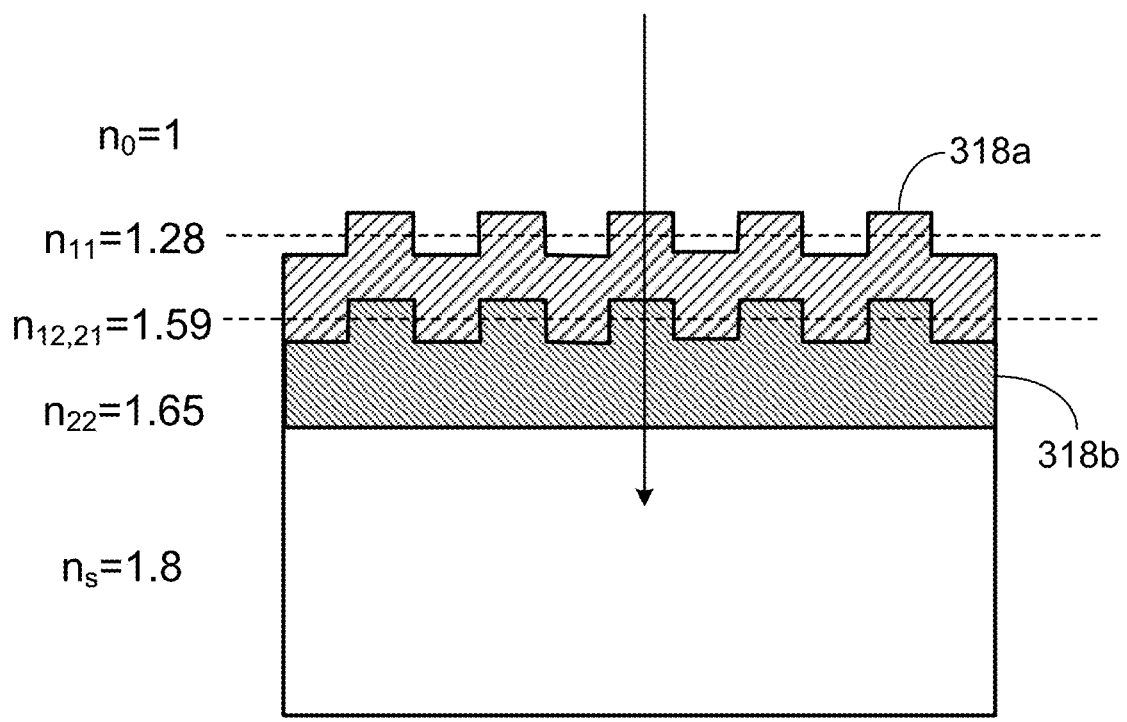
FIG. 12 is a diagram illustrating effects of stacking featured nanopatterns atop a substrate.

Patterning a single material (of index 1.52) with nanofeatures such as pillars of width of 50 nm, height of 100 nm and pitch of 100 nm in a square array with a very thin (<50 nm) residual layer thickness (interconnecting material film for nanofeatures of same material), the effective refractive index at the nanofeature material-air interface now becomes 1.28, which further improves transmission by 7.71% when compared to bare glass-air interface. Similarly, if the material index was 1.65, then this effective refractive index at the nanofeature material-air interface now becomes 1.32, thus improving transmission by 7.02% over bare glass-air interface. This type of embodiment is captured in FIG. 12, where the low index material (e.g., 1.52) AR nano-feature 318a is imprinted over a higher index material (e.g., 1.65) AR nano-feature 318b that is flush with the surface of the high index glass 1.78.

TABLE 1

Measured refractive indexes of film-air interfaces of various film stack architectures.

| Description of Nanofilm Structure Layers over Substrate | Measured Refractive Index of surface open to Air (n = 1) | Through Transmission at 590 nm | % Transmission Improvement over Bare Substrate |
|---|---|---|---|
| Bare High Index Substrate (n = 1.78) 300 um thick w/Back side Inorganic AR Coating | NA | 91.91% | — |
| Blank Imprint Film (n = 1.52) 100 nm thick on High Index Substrate (n = 1.78) 300 um thick w/Back side Inorganic AR Coating | 1.52 | 95.82% | 4.25% |
| Blank Imprint Film (n = 1.65) 100 nm thick on High Index Substrate (n = 1.78) 300 um thick w/Back side Inorganic AR Coating | 1.65 | 93.71% | 1.96% |
| Blank Imprint Film (n = 1.52) 100 nm thick over Blank Imprint Film (n = 1.65) 100 nm thick on High Index Substrate (n = 1.78) 300 um thick w/Back side Inorganic AR Coating | 1.52 (Imprint over 1.65) | 96.59% | 5.09% |
| Imprint Geometry with 100 nm Pitch 50 nm Diameter Pillar with n = 1.52 material on High Index Substrate (n = 1.78) 300 um thick w/Back side Inorganic AR Coating | 1.28 (using 1.52 material) | 99.00% | 7.71% |
| Imprint Geometry with 100 nm Pitch 50 nm Diameter Pillar with n = 1.65 material on High Index Substrate (n = 1.78) 300 um thick w/Back side Inorganic AR Coating | 1.32 (using 1.65 material) | 98.36% | 7.02% |
| Imprint Geometry with 100 nm Pitch 50 nm Diameter Pillar with n = 1.52 material over Imprint Geometry with 100 nm Pitch 50 nm Diameter Pillar with n = 1.65 material on High Index Substrate (n = 1.78) 300 um thick w/Back side Inorganic AR Coating | 1.28 (using pillar geometry material 1.52 over pillar of geometry material 1.65) | 99.49% | 8.25% |

Figure 13:
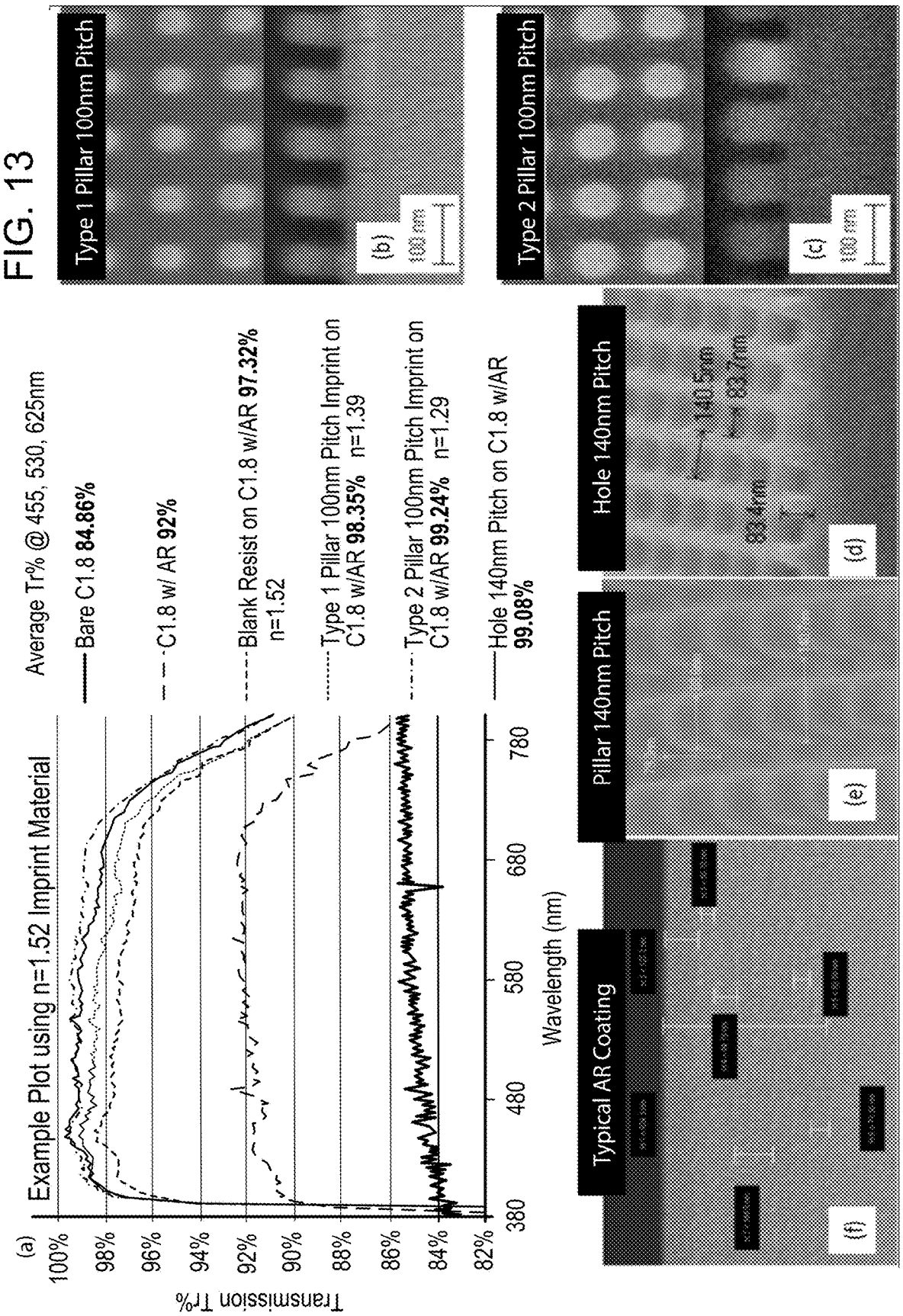
FIG. 13 is a graph of light transmission through a substrate with various treatments applied to the substrate.
Figure 14:
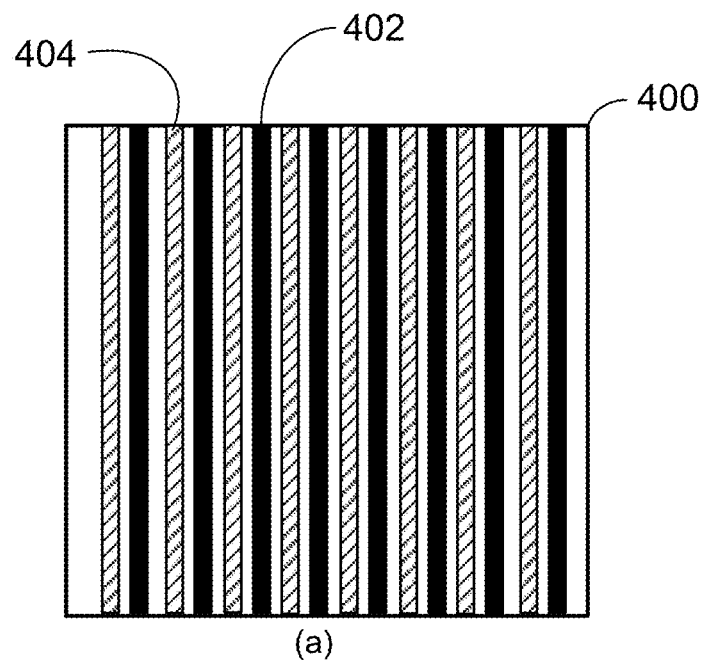
FIG. 14 is a diagram illustrating a substrate with nanoimprint gratings applied in a same direction (a) and in a perpendicular direction (b) as compared to a direction of diffraction gratings of a functional pattern on the substrate.
Figure 14:
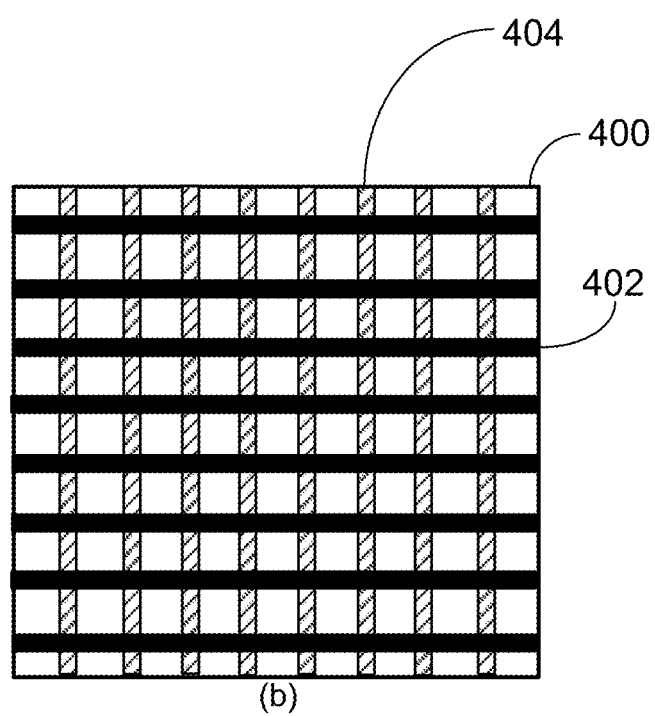

By further combining these two nano-feature imprinted films with the same nano-pattern where the lower index material (1.52) film with nano-features is exposed to air and the residual layer of the nano-patterned higher index material (1.65) film touches the glass surface (1.78) such that the residual layer thickness of the lower index (1.52) film covers the nano-features of the higher index material (1.65), the effective refractive index at the material-air interface remains 1.28, but the stack overall is more transmissive to light at a 590 nm wavelength due to a gradual change of index as light propagates through to the glass interface. For example, an improved transmittance over the visible wavelength spectrum is shown in FIG. 13a. FIGS. 13b-13e also shows examples of a near optimally patterned nano-feature film surface with film thicknesses less than 130 nm and with pillar (refer to FIGS. 13b, 13c, and 13e) and hole tone (refer to FIG. 13d) geometry, as compared to a standard anti-reflective multi-layer film (refer to FIG. 13f), which can be several hundred nanometers of high and low index film coatings. FIG. 14 illustrates a diagram (a) showing a substrate 400 with nanoimprint gratings 402 (blue) applied in a same direction as diffraction gratings 404 (gray) of a functional pattern (wire grid polarizer) on the substrate. The nanoimprint gratings 402 and the diffraction gratings 404 are located on opposite sides of the substrate 400. FIG. 14 also illustrates a diagram (b) showing a substrate 400 with the nanoimprint gratings 402 (blue) applied across (e.g., at an angle of 90 degrees to) the diffraction gratings 404 (gray) of the functional pattern. The nanoimprint gratings 402 and the diffraction gratings 404 are located on opposite sides of the substrate 400.

Figure 15:
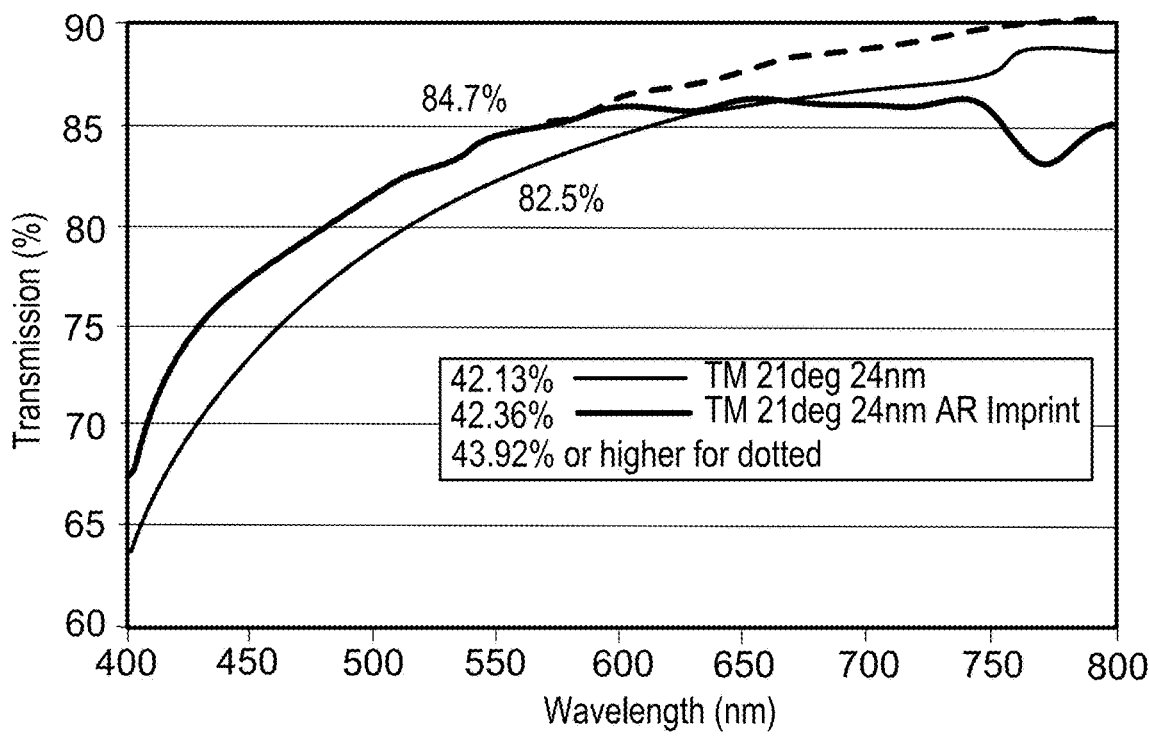
FIG. 15 is a graph of light transmitted through a substrate with various treatments applied to the substrate.
Figure 16:
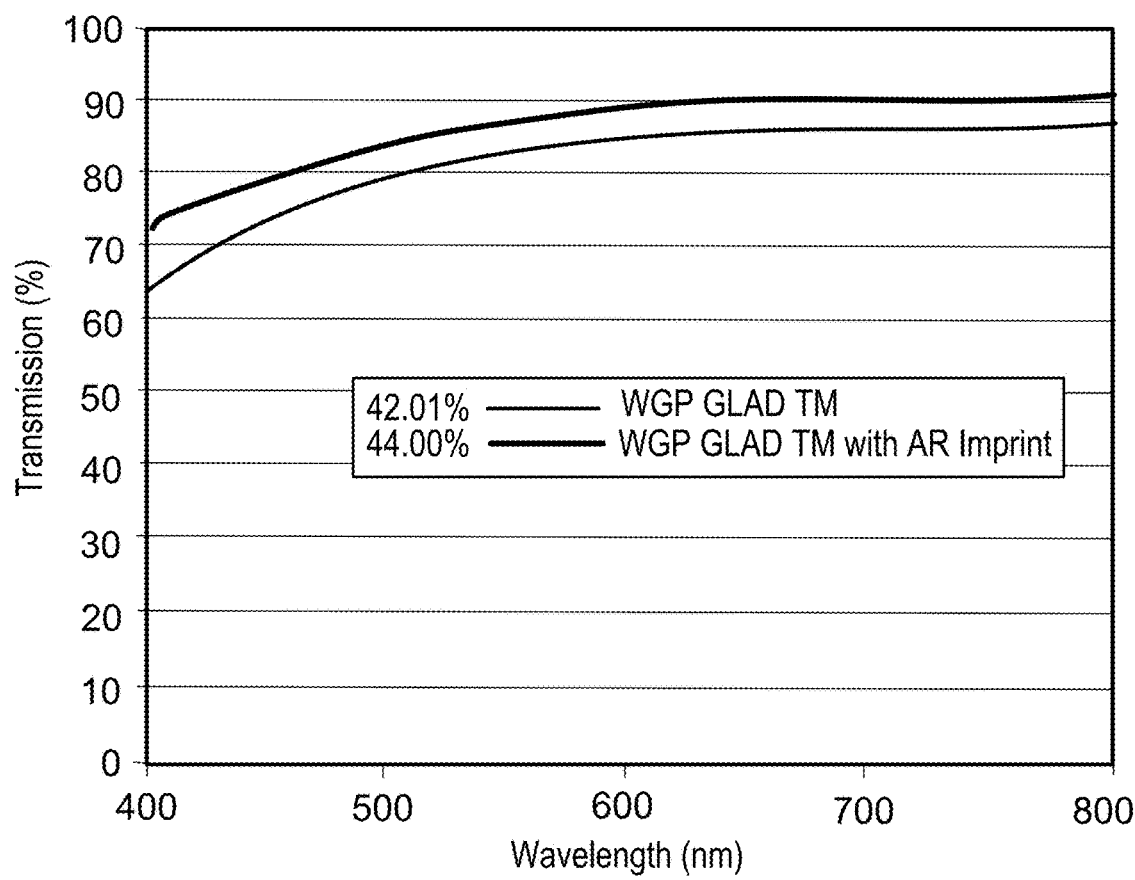
FIG. 16 is a graph of light transmitted through a WGP substrate with various treatments applied to the WGP substrate.

FIG. 15 illustrates a graph plotting light transmitted through a substrate with and without AR nanofeature type film. The grating type AR nanofeature imprint is applied to the back side of a WGP substrate where the grating of the AR imprint is orthogonal to the grating direction of the wire grid polarizer. As shown in the graph, applying the nanoimprint gratings in a direction across the direction of diffraction gratings increases the light transmission up to a wavelength of about 650 nm and decreases the light transmission at wavelengths greater than about 650 nm. The result illustrates a weak birefringence property when using grating type AR nanofeatures and applying such features in an orthogonal direction to the polarized light exhibiting the WGP pattern as the light encounters the AR gratings. Such features can reduce polarized light transmitted at higher wavelengths in such applications. This effect does not occur when using hole or pillar type AR nanofeatures. FIG. 16 shows effects with and without applying the grating type AR nanofeature along the WGP functional grating direction. It is shown that the light transmission increases overall over the visible spectrum by the grating type AR nanofeature imprint along the WGP.

Figure 17:
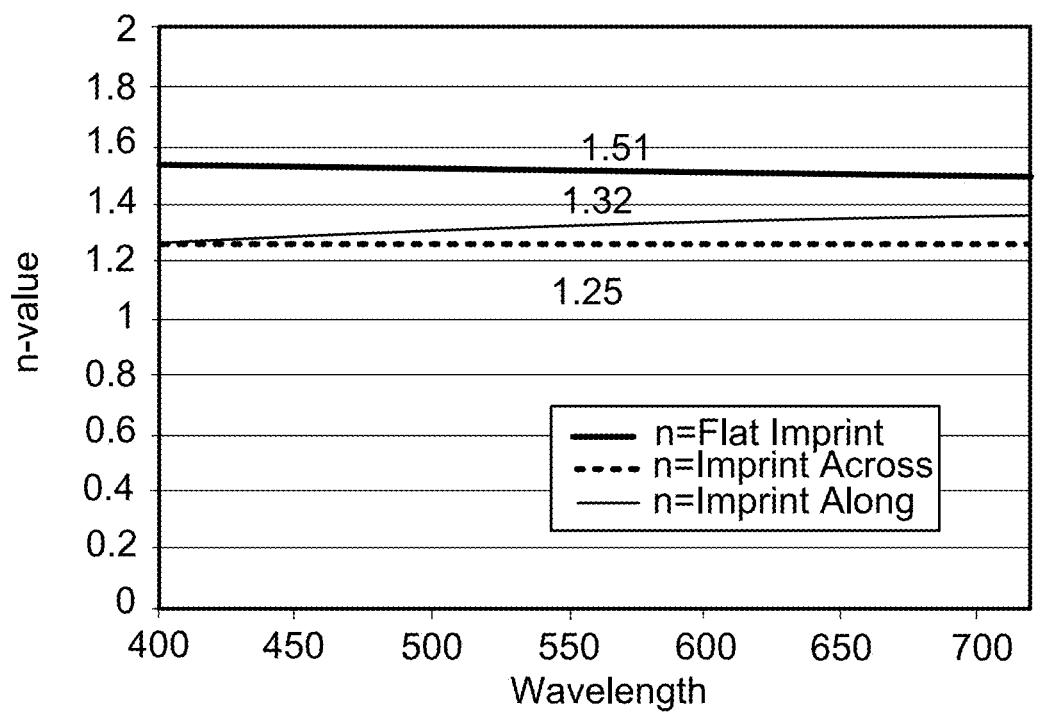
FIG. 17 is a graph of indexes of refraction for various substrate treatments.

The weak birefringence property exhibited by grating type AR nanofeature film is also illustrated by the graph in FIG. 17. The graph shows that effective surface refractive index of the grating type AR nano-feature changes from 1.25 (across grating) to about 1.32 (along grating) based on grating orientation to incoming linearly polarized light (provided by an ellipsometer) during refractive index measurement, which otherwise measures the refractive index of the material if a blank were to be imprinted as 1.52.

Figure 18:
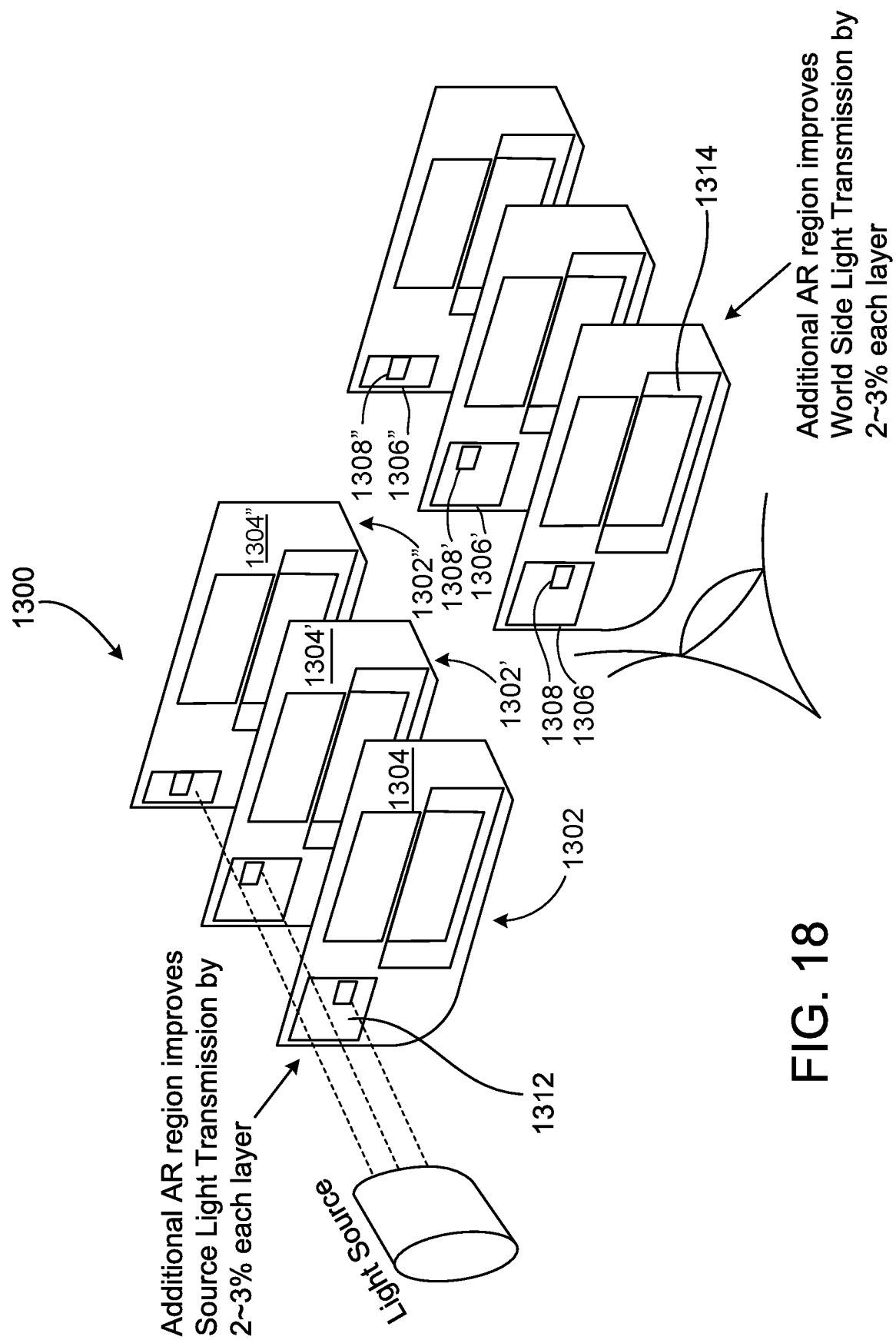
FIG. 18 is diagram illustrating light transmission through a multi-layer optical device.

FIG. 18 shows a multi-layer wearable eyepiece 1300 having first optical layer 1302, second optical layer 1302', and third optical layer 1302". First optical layer 1302, second optical layer 1302', and third optical layer 1302" include first substrate 1304, second substrate 1304', and third substrate 1304", respectively. First nanolayer 1306, second nanolayer 1306', and third nanolayer 1306" are imprinted on first substrate 1302, second substrate 1302', and third substrate 1302", respectively. First substrate 1302, second substrate 1302', and third substrate 1302" include first functional pattern 1308, second functional pattern 1308', and third functional pattern 1308", respectively. In an embodiment of the optical layer AR pattern as applied to a multilayer wearable eyepiece 1300, the AR pattern allows for more light to pass through from a projection system to the input coupling diffraction grating 1312 as light passes through multiple layers of the eyepiece. The AR pattern around the exit pupil diffraction grating 1314 allows for more world-side light to enter into the user's eye and reduces unwanted reflection or glare due to high reflectivity of the otherwise bare high index glass surface in air.

Figures 19, 20:
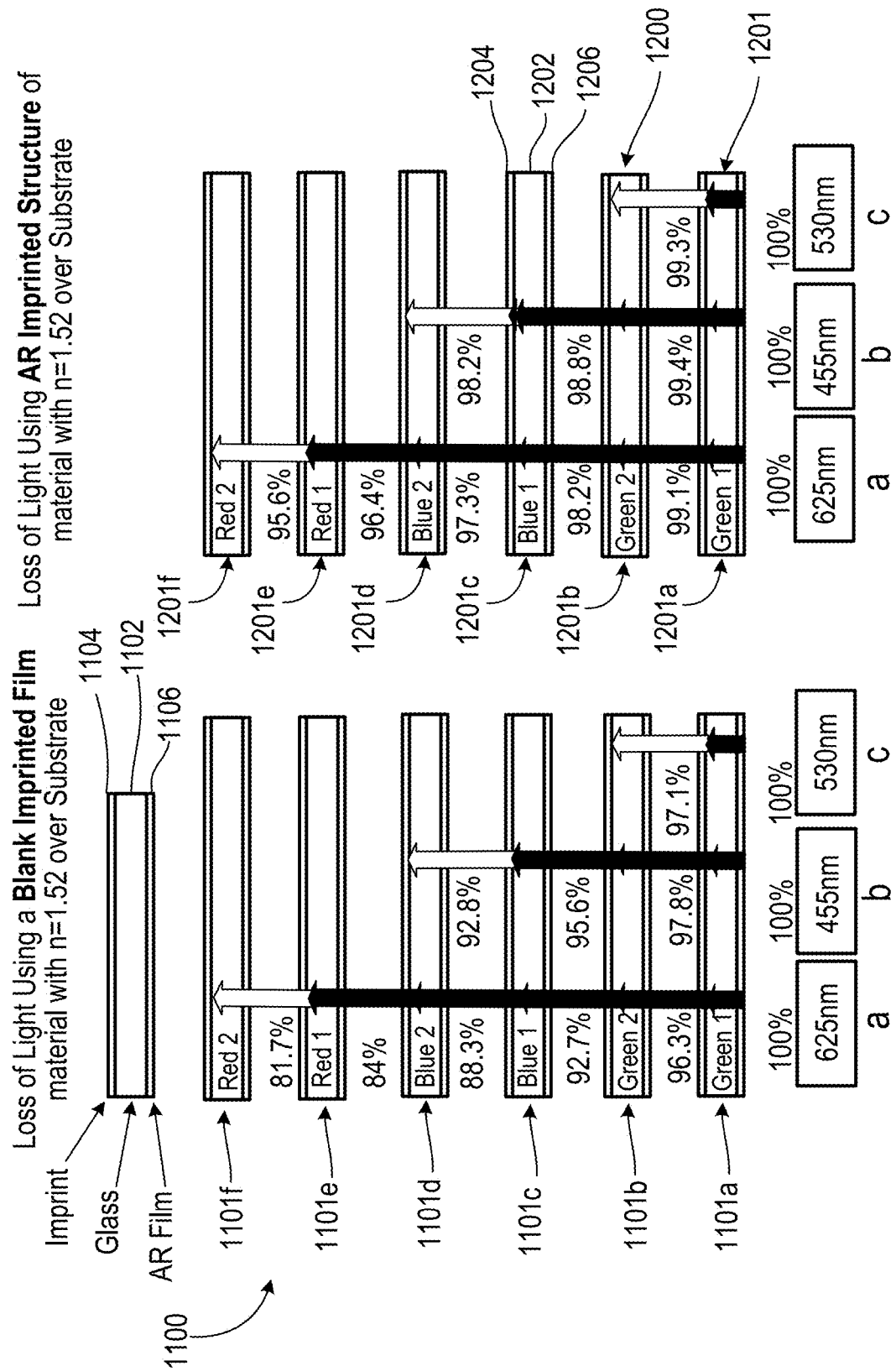
FIG. 19 is a diagram illustrating a light source directed towards multiple layers of a waveguide eye-piece that include a non-imprinted AR film.
FIG. 20 is a diagram illustrating a light source directed towards multiple layers of a waveguide eye-piece that include an imprinted AR nanolayer.

FIGS. 19 and 20 respectively show example stacks 1100, 1200 of waveguide eye-pieces using a light source with a red color of wavelength 625 nm (a), a green color of wavelength 530 nm (b) and a blue color of wavelength 455 nm (c) on one side of the stacks 1100, 1200. The stacks 1100, 1200 includes six layers 1101a-1101f, 1201a-1201f (e.g., of color red, blue, or green) located at different depths to which the light has to travel. Each of the layers 1101a-1101f of the stack 1100 include a substrate 1102, a blank imprint layer 1104 around a region of input coupling grating (ICG) (e.g., refer to the example optical layer 600 of FIG. 6), and a non-imprinted AR nanolayer 1106. Each of the layers 1201a-1201f of the stack 1200 include a substrate 1202, a blank imprint layer 1204 around a region of ICG, and an imprinted AR nanolayer 1206. As shown, only about 81.7% of light intensity reaches the last red layer 1101f of the stack 1100 (i.e., with the flat AR nanolayer 1106), whereas about 95.6% of light intensity reaches the last red layer 1201f of the stack 1200 (i.e., with the imprinted AR nanolayer 1206), such that the imprinted AR nanolayer 1206 provides a 13.9% absolute improvement in light intensity.

Figure 21:
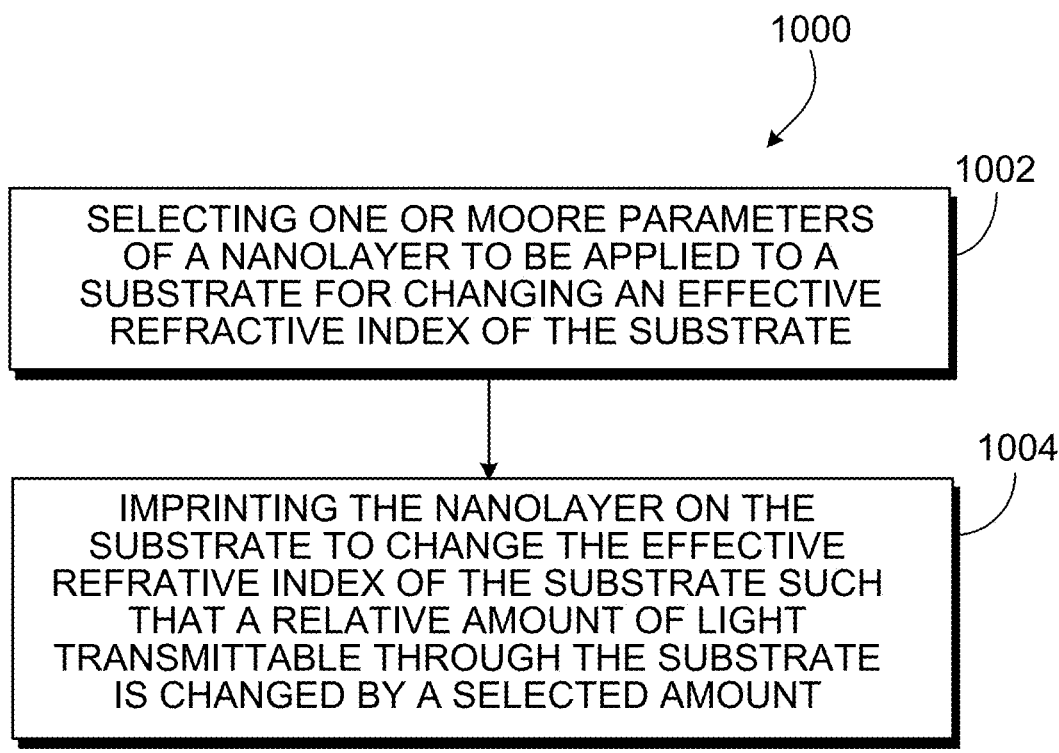
FIG. 21 is a flow chart of an example process for configuring an optical layer in an imprint lithography process.

FIG. 21 displays a flow chart of an example process 1000 for configuring an optical layer (e.g., the optical layer 200, 500, 600, 700, 800, 900) in an imprint lithography process. One or more parameters of a nanolayer (e.g., the nanoimprint 210, 214, 316, 318, 510, 610) to be applied to a substrate (e.g., the substrate 202, 400) for changing an effective refractive index of a substrate (e.g., a material-air interface on the substrate) are selected (1002). In some examples, the one or more parameters include one or more of a shape, a dimension, and a material formulation of the nanolayer. The nanolayer is imprinted on the substrate (e.g., the upper side 204 or the lower side 206 of the substrate 202) to change the effective refractive index of the substrate such that a relative amount of light transmittable through the substrate is changed by a selected amount (1004). For example, a bare substrate without any applied coating or nanoimprint may have an effective refractive index that is equal to an actual, bulk refractive index of the substrate. In some examples, applying the nanolayer changes the effective refractive index from the actual, bulk refractive index to new effective refractive index. In some embodiments, imprinting the nanolayer on the substrate to change the effective refractive index of the substrate includes changing a second relative amount of light reflected from a surface of the substrate.

In some embodiments, the nanolayer is a flat nanoimprint (e.g., the nanoimprint 316). In some embodiments, the nanolayer is a featured nanoimprint (e.g., the nanoimprint 318). In some embodiments, the nanopattern includes AR features (e.g., pillars, holes, and/or gratings). In some examples, the AR features have a height in a range of about 10 nm to about 300 nm. In some examples, the AR features have a width in a range of about 10 nm to about 150 nm. In some examples, the AR features are distributed with a pitch in a range of about 20 nm to about 200 nm. In some embodiments, imprinting the nanolayer includes forming pillars (e.g., the pillars 300, 306, 308) on the substrate. In some embodiments, imprinting the nanolayer includes forming holes 302 on the substrate. In some embodiments, imprinting the nanolayer includes forming one or both of continuous gratings and discontinuous gratings (e.g., the gratings 314, 402) on the substrate.

In some embodiments, the process further includes forming a functional pattern on a first side of the substrate and imprinting the nanolayer along one or both of the first side of the substrate and a second side of the substrate opposite the first side of the substrate. In some examples, imprinting the nanolayer includes forming AR features of the nanolayer along a specific direction with respect to the functional pattern the functional pattern. In some examples, imprinting the nanolayer includes forming AR features along a direction perpendicular to diffraction gratings of the functional pattern. In some embodiments, the process further includes applying a film coating (e.g., the film coating 212) to the substrate and imprinting the nanolayer atop the film coating.

In some embodiments, the process further includes changing the relative amount of light transmitted through the substrate by about 0.5% to about 15%. In some embodiments, the nanopattern is a first nanolayer, and process further includes imprinting a second nanolayer atop the first nanolayer. In some embodiments, the process further includes changing the effective refractive index to a first value based on the first nanolayer and changing the effective refractive index to a second value based on the second nanolayer.

Advantageously, the process 1000 can be used to produce AR patterns that may reduce the surface reflection of a substrate by about 1% to about 10%. Such AR patterns may increase the transmissivity of the substrate to greater than about 98% for a plastic substrate and up to about 99% for a glass substrate. The AR patterns may also provide the substrate with a new effective refractive index in a range of about 1.2 to about 1.4, such that transmission of light through the substrate is increased. Furthermore, the AR patterns discussed herein may introduce birefringence to diminish or enhance refraction of certain light wavelengths transmitted through the substrate. In some implementations, weak birefringence can be advantageous if there is a need to modulate the phase of light propagating within and through the substrate. In addition, at the specified dimensions of the AR nanopattern 214 and the functional diffraction patterns 208, the AR nanopattern 214 does not diffract light as does the functional diffraction patterns 208. As a result, the AR nanopattern 214 does not interfere with the diffractive optics of the optical device. Furthermore, the AR nanopattern 214 provides an anti-stick surface that can maintain a certain predefined gap in case two substrate layers in close proximity to each other should be pushed against each other.

While the substrates discussed herein have been assumed to have a refractive index of about 1.78 to about 1.8, other substrates that may be used in optical devices discussed herein may have a refractive index in a range of about 1.45 to about 2.4.

While a number of embodiments have been described for illustration purposes, the foregoing description is not intended to limit the scope of the invention, which is defined by the scope of the appended claims. There are and will be other examples, modifications, and combinations within the scope of the following claims.

What is claimed is:

1. An optical device, comprising:
   a first optical layer, comprising:

a first substrate, and
a nanolayer imprinted directly on the first substrate; and
a second optical layer comprising:
a second substrate; and
a first functional pattern disposed along the second substrate; and
a third optical layer comprising a third substrate and a second functional pattern disposed along the third substrate,
wherein the nanolayer imprinted directly on the first substrate determines an effective refractive index of the first substrate such that the nanolayer increases a relative amount of light transmittable through the first substrate to the second optical layer.

2. The optical device of claim 1, wherein the nanolayer imprinted directly on the first substrate is a first nanolayer, wherein the effective refractive index of the first substrate is a first refractive index, wherein the relative amount of light is a first relative amount of light, and wherein the second optical layer comprises a second nanolayer imprinted on the second substrate, the second nanolayer determining a second effective refractive index of the second substrate such that the second nanolayer increases a second relative amount of light transmittable through the second substrate to the third optical layer.

3. The optical device of claim 2, wherein the first and second nanolayers are configured such that a final amount of light transmitted through the first and second substrates to the third optical layer is about equal to an amount of light directed from a source to the first nanolayer, minus a first amount of light reflected from the first substrate and minus a second amount of light reflected from the second substrate.

* * * * *